United States Patent [19]

Dalichow et al.

[11] 4,041,387

[45] Aug. 9, 1977

[54] APPARATUS AND METHOD FOR MEASURING THE FREQUENCY OF A SWEEPING SIGNAL

[75] Inventors: Rolf W. Dalichow; Frederic W. Woodhull, both of Santa Rosa, Calif.

[73] Assignee: Hewlett-Packard Company, PaloAlto, Calif.

[21] Appl. No.: 614,570

[22] Filed: Sept. 18, 1975

[51] Int. Cl.² ............................................. G01R 23/02
[52] U.S. Cl. ................................ 324/78 R; 324/77 C
[58] Field of Search ............... 324/77 C, 77 CS, 78 R, 324/78 D, 79 D; 235/151, 32, 91 D; 325/332–337; 307/233 R; 340/329 G

[56] References Cited

U.S. PATENT DOCUMENTS

| 3,643,126 | 2/1972 | Hay ..................................... 324/77 C |
| 3,735,347 | 5/1973 | Whitney ............................ 324/78 D |
| 3,803,486 | 4/1974 | Russell ................................ 324/78 D |

*Primary Examiner*—Rudolph V. Rolinec
*Assistant Examiner*—Michael J. Tokar
*Attorney, Agent, or Firm*—Patrick J. Barrett

[57] ABSTRACT

A swept frequency measuring system is provided with an electronic counter for measuring the frequency of the sweeping signal from a sweeping signal generator, at a predetermined point in the sweep indicated by a marker. Upon the occurrence of a marker, the counter starts counting the frequency of the signal while the sweeping signal generator continues to sweep. After a predetermined interval, the counter stops counting for a second predetermined interval and, then, during a third predetermined interval counts down from the count made during the first interval. The resultant count remaining in the counter is an indication of the frequency of the sweeping signal at the marker, and this count is displayed in a digital display.

8 Claims, 4 Drawing Figures

APPARATUS AND METHOD FOR MEASURING THE FREQUENCY OF A SWEEPING SIGNAL

BACKGROUND OF THE INVENTION

Swept frequency measurement systems are used to characterize the frequency response of a variety of electronic devices such as amplifiers, filters, attenuators and systems using such components. A swept frequency measurement system usually includes a sweeping signal generator which supplies a signal that changes frequency linearly with time. The signal is supplied to a device under test and the output of the device under test is displayed as either absolute or relative magnitude or phase as a function of frequency. Since it is desirable to have an accurately calibrated frequency axis in such a display, a number of methods have been used in the prior art.

The display itself may be marked with graduations, such as a graticule on a cathode ray tube (CRT), that are calibrated according to frequency. This method has the disadvantage that a change in the calibration or the frequency range of the sweeping signal generator will make the display uncalibrated and cannot be detected without the aid of additional test equipment. This limitation is significant because the range over which the sweeping signal generator sweeps may be easily changed on most commercially available generators.

A second method of providing frequency calibration on a swept frequency measurement system display is to use one or more CW signals which are shown simultaneously or alternatively on the display. These signals may also be used to produce markers on the display, thus serving much the same function as a calibrated graticule on a CRT. This method has the disadvantage that it is still not possible to know the frequency of a point between the markers accurately, since interpolation is required.

A third method of providing frequency information in a swept frequency measurement system involves the use of a counter which is used to count the frequency of the sweeping signal. In order to count the signal frequency at a particular point, the sweeping of the signal generator is stopped before the counter gate is opened. The counter then counts the frequency of the signal at the marker, and after the count has been terminated the sweep is started again. In this method it is necessary to stop the sweep since simply counting the output signal from the sweeping signal generator would not produce an accurate result because the signal is continuously changing frequency. Such a system is described, for example, in U.S. Pat. No. 3,643,126 issued to Robert R. Hay, Feb. 15, 1972. This system has the disadvantage, however, that it is necessary to stop the sweep of the sweeping signal generator while the count is made, thus disrupting the measurement and requiring extra control lines between the counter and the sweeping signal generator.

SUMMARY OF THE INVENTION

According to the preferred embodiment of the present invention, an up-down frequency counter is provided with a control circuit to activate the counter in a manner that will allow it to compute the frequency of a signal at the time a marker occurs without requiring a halt in the sweep of a sweeping signal generator supplying the signal. A marker is generated by comparing the sweep voltage from the sweeping signal generator with a variable reference. When the marker is generated, the counter gate is opened and the counter starts counting up. After a first time interval, the counter stops counting and remains stopped during a second time interval during which the sweeping signal generator continues to sweep. Then during a third time interval, the updown counter counts down, that is, subtracts the count made during the third time interval from the count made during the first time interval. When the counter has finished counting down during the third time interval, the result remaining in the counter is a measure of the frequency of the output signal from the sweeping signal generator at the time the marker occurred. This signal is then displayed in a digital display.

DESCRIPTION OF THE PREFERRED EMBODIMENT

Measuring the frequency of a CW signal is a relatively simple matter using an electronic counter. A counter counts the the number of periods of the signal that occur during the time the counter gate is open, and the frequency of the signal can be determined by dividing the number of periods counted by the interval of time during which the gate was open. This can be expressed as:

$$n = f \times \tau$$

where $n$ is the number of periods, $f$ is the frequency and $\tau$ is the time interval over which $n$ was counted.

Figure 1:
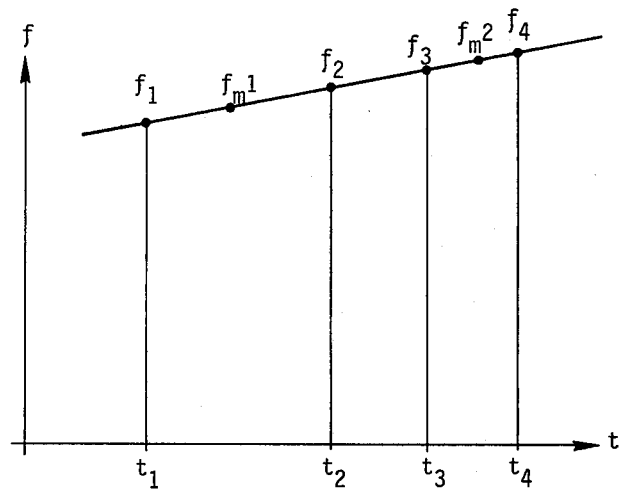
FIG. 1 shows a graph of the frequency of the output signal from a sweeping signal generator plotted as a function of time.

If the frequency of a signal being counted is not constant during the time the gate is open, the resultant count will represent the average frequency during the time the gate was open. Thus, if the frequency of a signal is changing as shown in FIG. 1 and a counter gate is open between time $t_1$ and $t_2$ when the signal is changing from frequency $f_1$ to $f_2$, the resultant count will indicate the frequency $f_{mb}$ the mean of frequencies $f_1$ and $f_2$. If the frequency is changing linearly with time as shown in FIG. 1, then frequency can be expressed as follows:

$$f(t) = at + b \quad (1)$$

where $a$ is the slope and $b$ is the $y$ intercept. As mentioned above, the number of pulses or periods counted between $t_1$ and $t_2$ gives the average frequency and this number of pulses, $n_{12}$, can be computed by integrating the frequency function over time:

$$n_{12} = \int_{t_1}^{t_2} f(t)\, dt \quad (2)$$

$$n_{12} = \int_{t_1}^{t_2} (at + b)\, dt \quad (3)$$

$$n_{12} = \frac{a}{2}(t_2^2 - t_1^2) + b(t_2 - t_1). \quad (4)$$

The average frequency between $t_1$ and $t_2$ computed as above is not particularly useful in a swept frequency measurement system, however, since the average depends upon the rate of sweep as well as the time period picked; and it is difficult to place a marker on a display that will correspond to the position of the average frequency. It is therefore much more desirable to have a marker occur at $t_1$ which is always accurately known, regardless of the gate time of the counter or the sweep rate of the sweeping signal generator. The frequency $f_1$ at time $t_1$ can be computed from the average frequency between $t_1$ and $t_2$, $f_{m1}$, by measuring another average frequency, $f_{m2}$, between times $t_3$ and $t_4$ as shown in FIG. 1 and then subtracting the two average frequencies:

$$f_1 = f_{m1} - f_{m2}. \quad (5)$$

From this it follows that:

$$n_1 = n_{12} - n_{34} \quad (6)$$

where $n_1$ is the number of counts corresponding to $f_1$, $n_{12}$ is the number of counts between $t_1$ and $t_2$ and $n_{34}$ is the number of counts between $t_3$ and $t_4$. Substituting in Equation 4 it follows that:

$$n_1 = \frac{a}{2}(t_2^2 - t_1^2) + b(t_2 - t_1) - \frac{a}{2}(t_4^2 - t_3^2) - b(t_4 - t_3). \quad (7)$$

One of many possible solutions to this equation may be achieved by defining the following relationships among the variables:

$$b = 0$$
$$t_2 = t_1 + 3\tau$$
$$t_3 = t_1 + 4\tau$$
$$t_4 = t_1 + 5\tau \quad (8)$$

where $\tau$ is an arbitrary, predetermined time period. Substituting these values in Equation 7 the following results:

$$n_1 = 2 a t_1 \cdot \tau \quad (9)$$

recalling that $at_1 = f_1$ and substituting in Equation 9 one finds:

$$n_1 = f_1(2\tau) \quad (10)$$

or $$f_1 = \frac{n_1}{2\tau}.$$

Thus the frequency $f_1$ can be computed by counting up between times $t_1$ and $t_2$ for an interval of $3\tau$, pausing between $t_2$ and $t_3$ for an interval of $\tau$, and down counting, or subtracting the count made, during the time from $t_3$ and $t_4$ for another interval of $\tau$. The frequency $f_1$ is the number of counts remaining in the counter at $t_4$ divided by $2\tau$.

Figure 2:
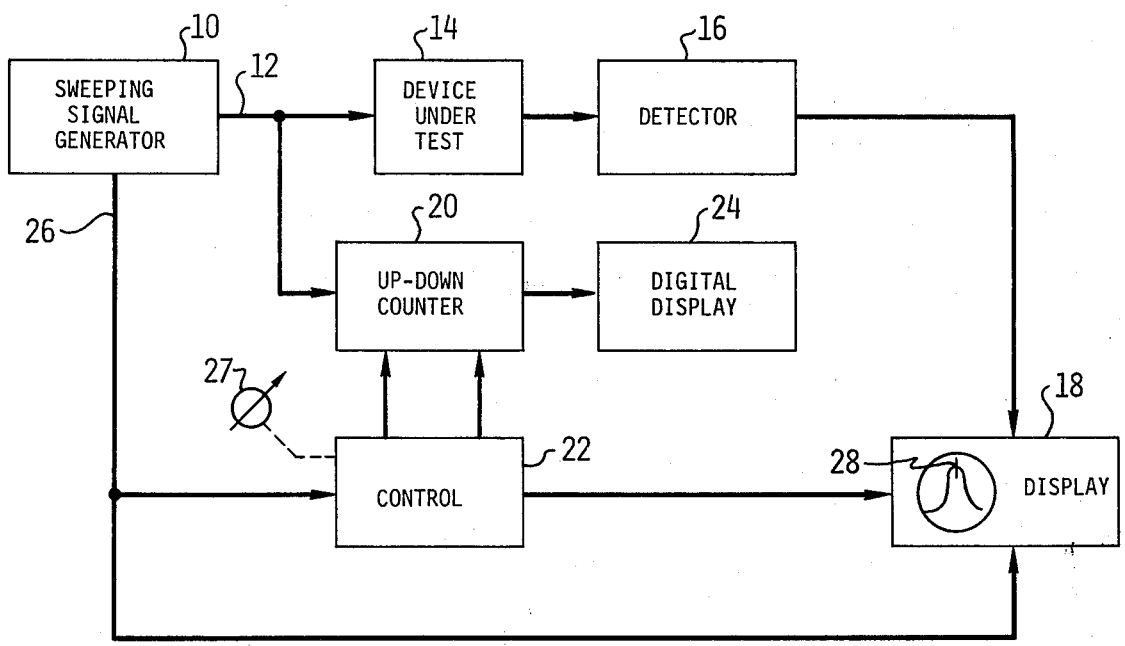
FIG. 2 shows a block diagram of the preferred embodiment of the present invention.

FIG. 2 shows a block diagram of a swept frequency measurement system with a preferred embodiment of the present invention connected thereto. A sweeping signal generator 10 produces an output a.c. signal which varies in frequency linearly with time. This output signal is supplied on a line 12 to a device under test 14, and the output of the device under test is connected to a detector 16. Detector 16 may be just a simple envelope detector, or may be a spectrum analyzer, network analyzer or the like. The output of detector 16 is shown on a display 18 which may have a cathode ray tube or other suitable device for displaying amplitude or phase versus frequency information.

An up-down counter 20 is also connected to line 12 to receive the output signal from sweeping signal generator 10. Up-down counter 20 in turn is connected to a control circuit 22 which opens and closes the gate of the counter and controls the up-down counting mode of the counter. Up-down counter 20 is also connected to a digital display 24 for displaying the resultant count. A line 26 from sweeping signal generator 10 carries a sweep signal which changes in value with the change in frequency of the output signal. The sweep signal is usually the same signal that is used to tune the oscillator in the sweeping signal generator. Control circuit 22 is connected to line 26 so that the signal on line 26 can be compared with a reference signal in the control circuit designating the position of a marker 28 on the display. A control 27 adjusts the reference signal to control the position of the marker. The marker produced by control circuit 22 may be, for example, a bright spot produced on the CRT by modulating the z axis. It can also be produced by any of several other known techniques for producing markers on a swept frequency display, such as varying the signal on one or both of the other CRT axes. The sweep signal in sweeping signal generator 10 is also connected to display 18 to provide the horizontal deflection on the CRT.

Figure 3:
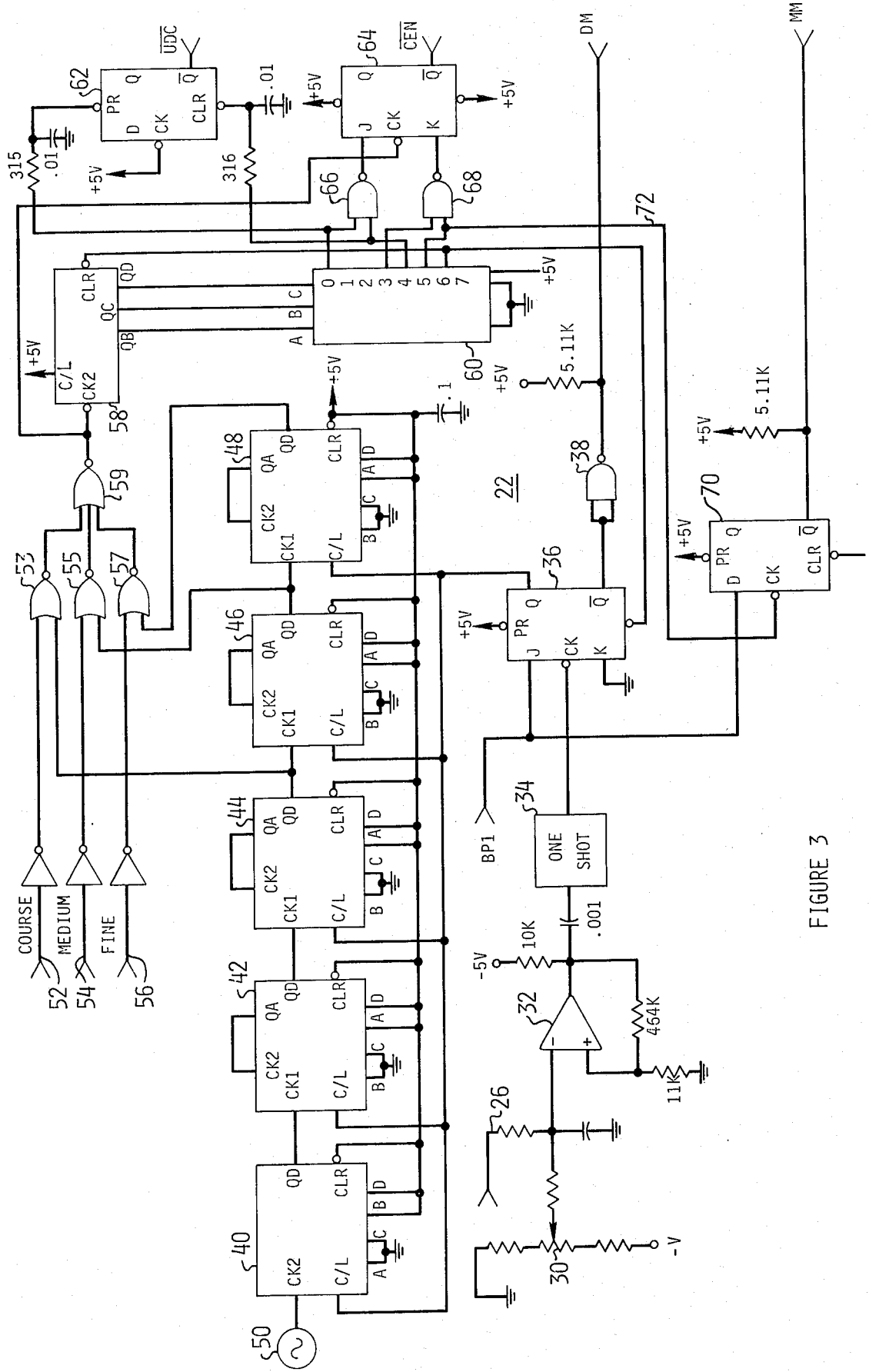
FIG. 3 and FIG. 4 show more detailed schematic diagrams of the apparatus shown in FIG. 2.

FIG. 3 shows a more detailed schematic diagram of control circuit 22. The sweep signal on line 26 is compared with a reference signal from a potentiometer 30 by comparator 32. The output of comparator 32 is connected to a one shot 34 so that when the sweep signal is equal to the reference signal, a pulse appears on the output of one shot 34. One shot 34 is connected to the clock input of a flip-flop 36 and the J input of the flip-flop is connected to receive a signal BP1 from the sweeping signal generator. Most sweeping signal generators provide a blanking pulse output to blank the display in a swept frequency measurement system during the time the signal is retracting, i.e., resetting to a lower frequency value. The signal BP1 is high when there is no retrace blanking signal and low when the display is blanked, to inhibit the counter during retrace. If the sweeping signal generator being used with the preferred embodiment of the invention does not provide such a signal, the J input of flip-flop 36 may be tied high, although an erroneous reading may be produced during the retrace of the signal generator.

The $\overline{Q}$ output of flip-flop 36 is connected through an inverter 38 to the DM output which may be connected, as mentioned above, to the z axis input of a display for providing a marker. Alternatively, this signal can be supplied to marker circuit for providing a pip or vertical deflection on the display screen. The Q output of flip-flop 36 is connected to a chain of dividers 40, 42, 44, 46 and 48. These dividers are connected to a reference clock or oscillator 50. When a high signal appears on the Q output of flip-flop 36, all of the dividers 40 through 48 are enabled and the signal from oscillator 50 ripples through the divider stages. These dividers act as a timer to produce the time interval, $\tau$, mentioned above. The length of the time interval, $\tau$, is determined by lines 52, 54 and 56, labeled coarse, medium and fine.

A signal on one of these lines will gate the output from dividers 44, 46 or 48 respectively to an eight-state binary counter 58. The coarse, medium and fine lines determine the resolution of the frequency measurement and may be connected to the sweeping signal generator sweep-time control to change the resolution of the measurement in accordance with the rate of sweep of the sweeping signal generator. Alternatively, these lines may be connected to a switch for selecting the resolution of the measurement displayed on the digital display 24. If only a single resolution is desired, the output of one of the dividers 44, 46 or 48 may be connected directly to the clock input of counter 58.

Counter 58 is connected to a decoder 60 which decodes the eight states of the counter into eight separate lines. Counter 58 advances each time it receives a signal from the divider chain via gates 53, 55, 57 and 59. Decocer 60 is connected to a flip-flop 62 and to a flip-flop 64 via gates 66 and 68. Gate 62 produces a signal $\overline{UDC}$ at its $\overline{Q}$ output which governs the up or down count state of up-down counter 20. Flip-flop 64 $\overline{Q}$ output produces a signal $\overline{CEN}$ which starts and stops the up-down counter by opening and closing a gate.

When the marker pulse is generated by flip-flop 36, counter 58 is advanced to its zero state and this pulse is used as a start pulse to cause $\overline{UDC}$ to be in its up count state and $\overline{CEN}$ in its start or enable state. After counter 58 advances three states, i.e., after three intervals each of length $\tau$, $\overline{CEN}$ and $\overline{UDC}$ both change state to stop the counter and prepare it to count down. After another time interval of length $\tau$, the $\overline{CEN}$ again changes state to enable the counter again for another time interval $\tau$. At the end of this time interval, $\overline{CEN}$ again changes state to stop the counter. At this time a signal is supplied from decoder 60 to a flip-flop 70 via line 72 to produce a signal $\overline{MM}$ on flip-flop 70 output $\overline{Q}$ which indicates the end of the measurement.

Figure 4:
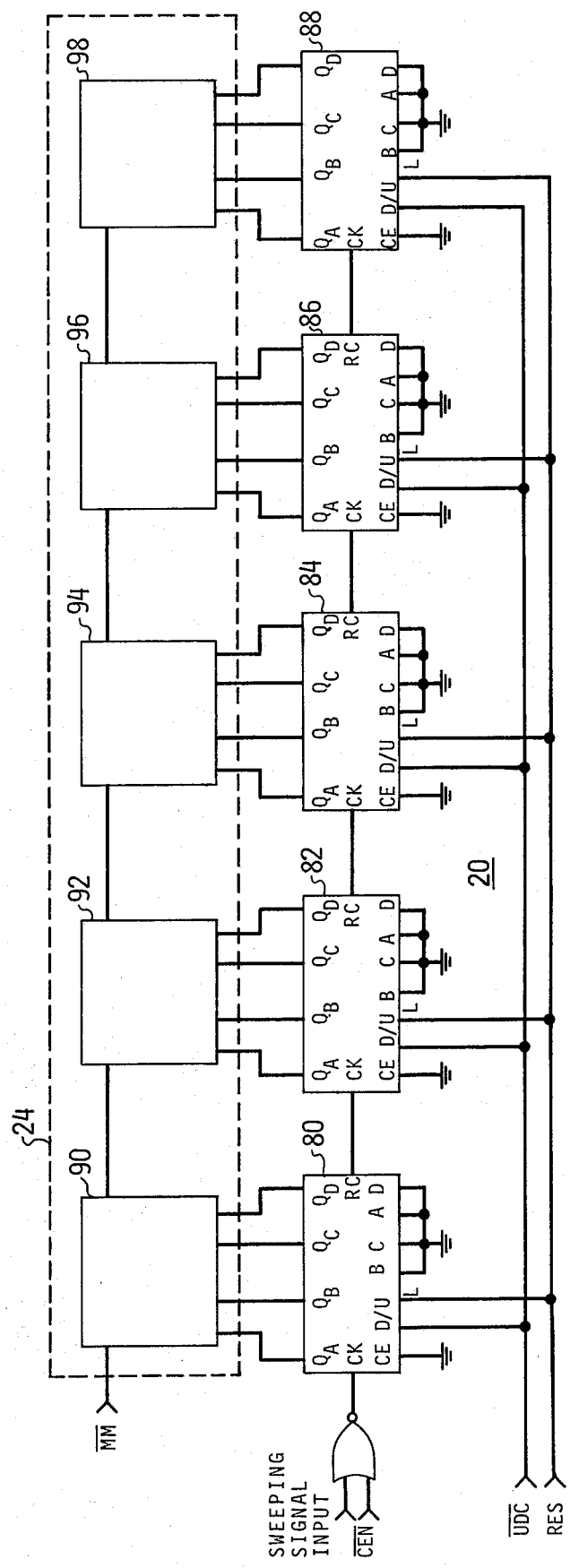

FIG. 4 shows a schematic diagram of an up-down counter 20 connected to a display 24. Up-down counter 20 is comprised of a plurality of stages 80, 82, 84, 86 and 88. Each of the counter stages is connected to one of the display modules 90, 92, 94, 96 and 98 in digital display 24. The $\overline{CEN}$ signal and the sweeping signal input are connected to a gate 100 which gates the sweeping signal to the counter modules 80, 82, 84, 86 and 88. $\overline{UDC}$ is connected to the up-down count control input of each of the counter stages and a reset line RES is provided for resetting the counter stages to zero. Signal $\overline{MM}$ is connected to the display modules to cause the display modules to display the counts in the counter stages when the measurement cycle is complete.

In order to obviate the need for further processing the final count $n_1$ in the up-down counter, $\tau$ is chosen so that $n_1 12\tau$ is in the units of frequency. Thus this final count can be displayed directly in digital display 24, and the decimal point is selected by the resolution setting on line 52, 54 or 56.

We claim:

1. A method for measuring the frequency of an output signal from a sweeping signal generator at a predetermined point in the sweep of the generator, the method comprising the steps of:
   receiving a start signal;
   counting the number of periods of the output signal during a first time interval in response to receipt of the start signal;
   stopping the counting during a second time interval subsequent to the first time interval; and
   counting the number of periods of the output signal during a third time interval subsequent to the second time interval and subtracting the number of periods of the output signal counted during the third time interval from the number of periods of the output signal counted during the first time interval, thereby producing a measurement number of counts indicative of the frequency of the output signal at the time the start signal was received.

2. A method as in claim 1 further comprising the steps of:
   receiving a sweep signal from the sweeping signal generator; and
   comparing the sweep signal with a reference signal and generating the start signal when the value of the sweep signal is equal to the value of the reference signal.

3. A method as in claim 2 wherein the second and third time intervals are each one third the length of the first time interval and the frequency of the output signal at the time the start signal was received is equal to the measurement number of counts divided by two thirds of the length of the first time interval.

4. An apparatus for measuring the frequency of an output signal from a sweeping signal generator at a predetermined point in the sweep of the sweeping signal generator, the apparatus comprising:
   a signal input circuit for receiving the output signal from the sweeping signal generator;
   start signal means for producing a start signal at a predetermined point in the sweep of the sweeping signal generator; and
   counter means connected to the signal input circuit and the start signal means for counting the number of periods of the output signal during first and third time intervals separated by a second time interval, and for subtracting the number of periods counted during the third time interval from the number of periods counted during the first time interval, producing thereby a number of counts indicative of the frequency of the output signal at the time the start signal was produced.

5. An apparatus as in claim 4 wherein the counter means comprises:
   a gate circuit;
   an up-down counter having a signal input connected to the gate circuit, an up-down input and an output;
   a timer having an input connected to the start signal circuit for starting the first time interval upon receipt of the start signal and an output for producing signals representing the beginning and end of the first, second and third time intervals; and
   a control circuit having an input connected to the timer output, a first output connected to the gate circuit and a second output connected to the up-down input for causing the gate circuit to open and the up-down counter to count up at the beginning of the first time interval, for causing the gate circuit to close at the beginning of the second time interval, for causing the gate circuit to open and the up-down counter to count down at the beginning of the third time interval, and for causing the gate circuit to close at the end of the third time interval.

6. An apparatus as in claim 5 wherein the start signal means comprises:
   a sweep signal input circuit for receiving a sweep signal from the sweeping signal generator;

a reference signal circuit for providing a reference signal; and a comparator connected to the sweep signal input circuit and the reference signal circuit for producing the start signal at an output thereof when the sweep signal and the reference signal have a predetermined relationship.

7. An apparatus as in claim 6 wherein the second and third time intervals are one third the length of the first time interval and the frequency of the output signal at the time of the start signal is equal to the number of counts in the up-down counter divided by two thirds of the length of the first time interval.

8. An apparatus as in claim 6 further comprising a display circuit having an input connected to the up-down counter output for displaying a number indicative of the frequency of the output signal.

* * * * *

UNITED STATES PATENT AND TRADEMARK OFFICE
CERTIFICATE OF CORRECTION

PATENT NO. : 4,041,387
DATED : 8/9/77
INVENTOR(S) : Rolf W. Dalichow, Frederic W. Woodhull It is certified that error appears in the above-identified patent and that said Letters Patent are hereby corrected as shown below:

Column 5, line 22, "CEN" should read --$\overline{CEN}$-- line 54, "$n_1 2\tau$" should read --$\dfrac{n_1}{2\tau}$--

Signed and Sealed this

Thirteenth Day of December 1977

[SEAL]

Attest:

RUTH C. MASON
*Attesting Officer*

LUTRELLE F. PARKER
*Acting Commissioner of Patents and Trademarks*